(12) United States Patent
Yamada

(10) Patent No.: US 6,789,239 B2
(45) Date of Patent: Sep. 7, 2004

(54) PROGRAM CONVERSION SYSTEM

(75) Inventor: Tsuyoshi Yamada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 91 days.

(21) Appl. No.: 10/218,523

(22) Filed: Aug. 15, 2002

(65) Prior Publication Data

US 2003/0158616 A1 Aug. 21, 2003

(30) Foreign Application Priority Data

Feb. 15, 2002 (JP) ........................................ 2002-039138

(51) Int. Cl.[7] .............................................. G06F 17/50
(52) U.S. Cl. .................................. 716/4; 716/5; 716/3
(58) Field of Search ................................ 716/4, 5, 3, 1; 700/97

(56) References Cited

U.S. PATENT DOCUMENTS 5,025,402 A * 6/1991 Winkelstein ................. 703/14
5,740,086 A * 4/1998 Komoto ...................... 702/120
6,546,528 B1 * 4/2003 Sasaki et al. ................... 716/5

OTHER PUBLICATIONS

Kraus et al., "Electromagnetics", 1973, McGrawHill, $2^{nd}$ edition, pp. 496–502.*

* cited by examiner

Primary Examiner—Vuthe Siek
Assistant Examiner—Sun James Lin
(74) Attorney, Agent, or Firm—McDermott Will & Emery LLP

(57) ABSTRACT

A circuit simulator performs a simulation for each tester using, as input values, tester parameters, test board parameters, and chip parameters. A difference acquiring section produces difference data of simulation results. A program converting section converts a test program for a first tester into a test program for a second tester based on the produced difference data. With this program conversion system, the load of tester replacement work can be reduced in the case where LSI products need to be tested by using different testers.

2 Claims, 6 Drawing Sheets

PROGRAM CONVERSION SYSTEM

BACKGROUND OF THE INVENTION

1. Field of the Invention

The present invention relates to a system for converting a test program for a semiconductor integrated circuit.

2. Background Art

To test an LSI (large-scale integrated circuit), first, the LSI to be tested is set on a DUT (device under test) board and the DUT board is set on a pin electronics unit of a tester. The tester judges whether the LSI functions normally by applying a test signal having a prescribed waveform to the LSI and checking a response signal from the LSI. The tester is equipped with a memory for storing programs and an operation device for executing those programs. A test program that is provided in the tester controls or performs signal transmission and reception and check processing.

In this configuration, the transmission line characteristics from the LSI to the tester influence test results. Therefore, after replacement of the tester or the test board, the same test results as before the replacement can no longer be obtained for the same LSI even if the same test program is used.

Conventionally, to replace the tester, deviations in signal timing that are caused by replacement of the tester are observed with an oscilloscope and the test program is modified or the test board is remade so that the deviations are corrected for.

However, adjustment based on observation results is cumbersome and takes time. Further, there is fear that the quality of a test program may lower if the level of the observation skill of an operator is low.

SUMMARY OF THE INVENTION

An object of the invention is therefore to provide a method for reducing the load of work of replacing a tester and making it possible to always obtain test programs that are uniform in quality.

Another object of the invention is to provide a program conversion system in which a process according to the above method is executed automatically.

First, a circuit simulator performs simulations for test environments before and after replacement of a tester. That is, the circuit simulator simulates a transmission line characteristic from a semiconductor integrated circuit that is assumed to be mounted on a test board to a tester that is assumed to be connected to the test board based on chip parameters indicating a circuit characteristic of the semiconductor integrated circuit, test board parameters indicating a circuit characteristic of the test board, and tester parameters indicating a circuit characteristic of the tester.

Then, difference acquiring means calculates a difference between transmission characteristics of the two test environments based on simulation results of the circuit simulator, that is, a difference between a transmission characteristic from the semiconductor integrated circuit to a first tester and a transmission characteristic from the semiconductor integrated circuit to a second tester.

Then, program converting means converts a first test program that was generated so as to conform to a first test board and the first tester into a second test program for a second test board and the second tester based on the calculated difference.

The invention also provides a test board designing system which is equipped with the same circuit simulator and the difference acquiring means. The test board designing system is further equipped with, in place of the program converting means, test board parameters determining means for determining test board parameters indicating a new circuit characteristic of the second test board so that the difference calculated by the difference acquiring means becomes equal to zero. That is, the test board designing system assists production of a test board suitable for a second test environment by providing parameters necessary to design the test board.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

A program conversion method and system according to the invention will be hereinafter described with reference to the accompanying drawings.

Figure 1A:
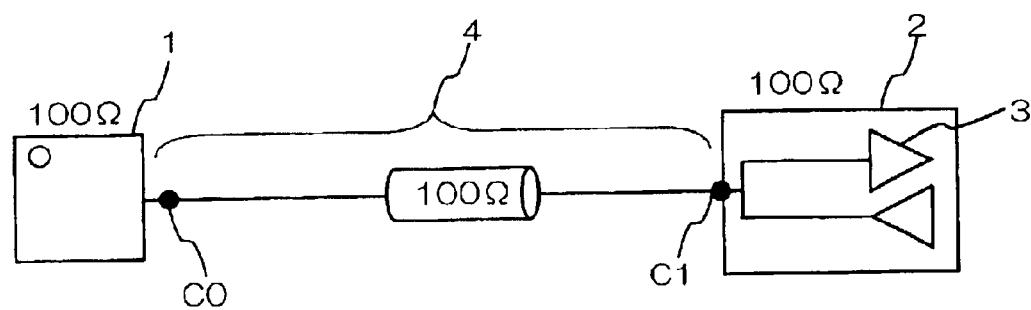
FIGS. 1A and 1B schematically show two kinds of test environments.

FIG. 1A schematically shows a transmission line from an LSI 1 to be tested that is set on a test board 4 to a pin electronics unit 3 of a tester 2. In FIG. 1A, point C0 is a connecting point between the LSI 1 and the test board 4 such as a DUT board and point C1 is a connecting point between the test board 4 and the pin electronics unit 3 of the tester 2. Each of the internal impedance of the LSI 1, the internal impedance of the tester 2, and the impedance of the test board 4 is equal to 100 Ω.

Figure 1B:
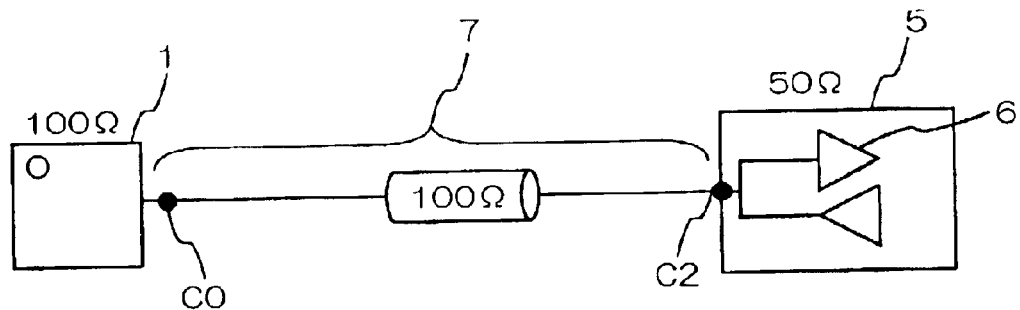

FIG. 1B schematically shows how the same LSI 1 as shown in FIG. 1A and a test board 7 and a tester 5 that are different from the test board 4 and the tester 2 shown in FIG. 1A are connected to each other. In FIG. 1B, point C0 is a connecting point between the LSI 1 and the test board 7 and point C2 is a connecting point between the test board 7 and a pin electronics unit 6 of the tester 5. The internal impedance of the tester 5 is equal to 50 Ω and the impedance of the test board 7 is equal to 100 Ω.

As is apparent from FIGS. 1A and 1B, the transmission line characteristics vary depending on the tester and the test board. Therefore, even if the LSI 1 outputs the same signal at point C0, signal waveforms observed at points C1 and C2 are different from each other.

Figure 2A:
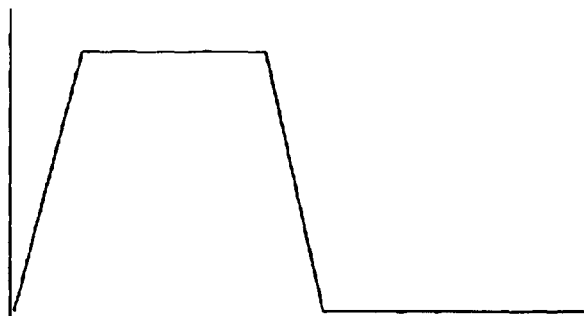
FIGS. 2A–2C show examples of signal waveforms on transmission lines.
Figure 2B:
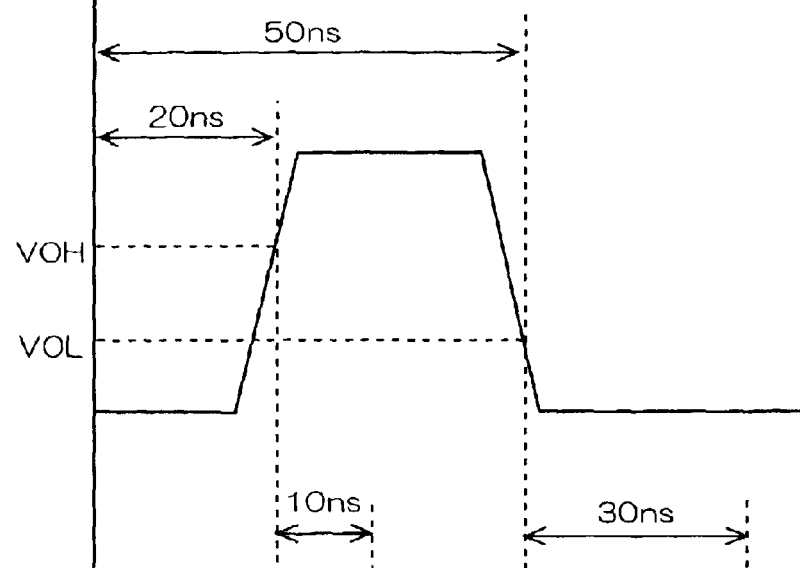
Figure 2C:
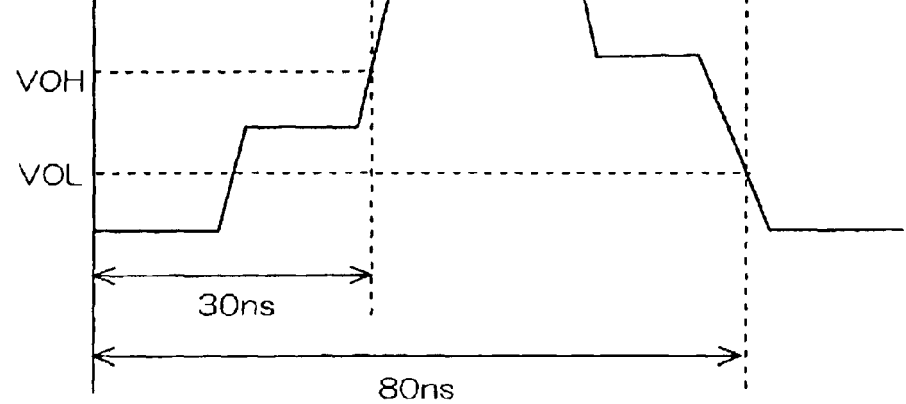

FIGS. 2A–2C are exemplary waveform diagrams showing how a signal waveform varies depending on the transmission line. FIGS. 2A, 2B, and 2C show signal waveforms at points C0, C1, and C2 shown in FIGS. 1A and 1B. The horizontal axis represents time and the vertical axis represents the signal level. Symbols VOH and VOL shown in FIGS. 2B and 2C denote a high level and a low level, respectively.

In the test environment of FIG. 1A, proper impedance matching is established. Therefore, the signal observed at point C1 has the same waveform as observed at point C0 though a delay occurs that corresponds to a transmission delay of the transmission line. On the other hand, proper impedance matching is not established in the test environment of FIG. 1B. Therefore, as shown in FIG. 2C, the signal observed at point C2 has two steps at each of a rising edge and a trailing edge. In this case, as seen from FIGS. 2A and 2C, not only a transmission delay but also a delay due to signal reflection occurs.

As shown in FIG. 2B, at point C1, the signal passes the high level after a lapse of 20 ns from a prescribed time point and then passes the low level after a lapse of 50 ns from the same prescribed time point. In contrast, as shown in FIG. 2C, at point C2, the signal passes the high level after a lapse of 30 ns and the passes the low level after a lapse of 80 ns. That is, the time point when the signal at point C2 passes the high level is 10 ns later than that when the signal at point C1 does so, and the time point when the signal at point C2 passes the low level is 30 ns later than that when the signal at point C1 does so.

Figure 3:
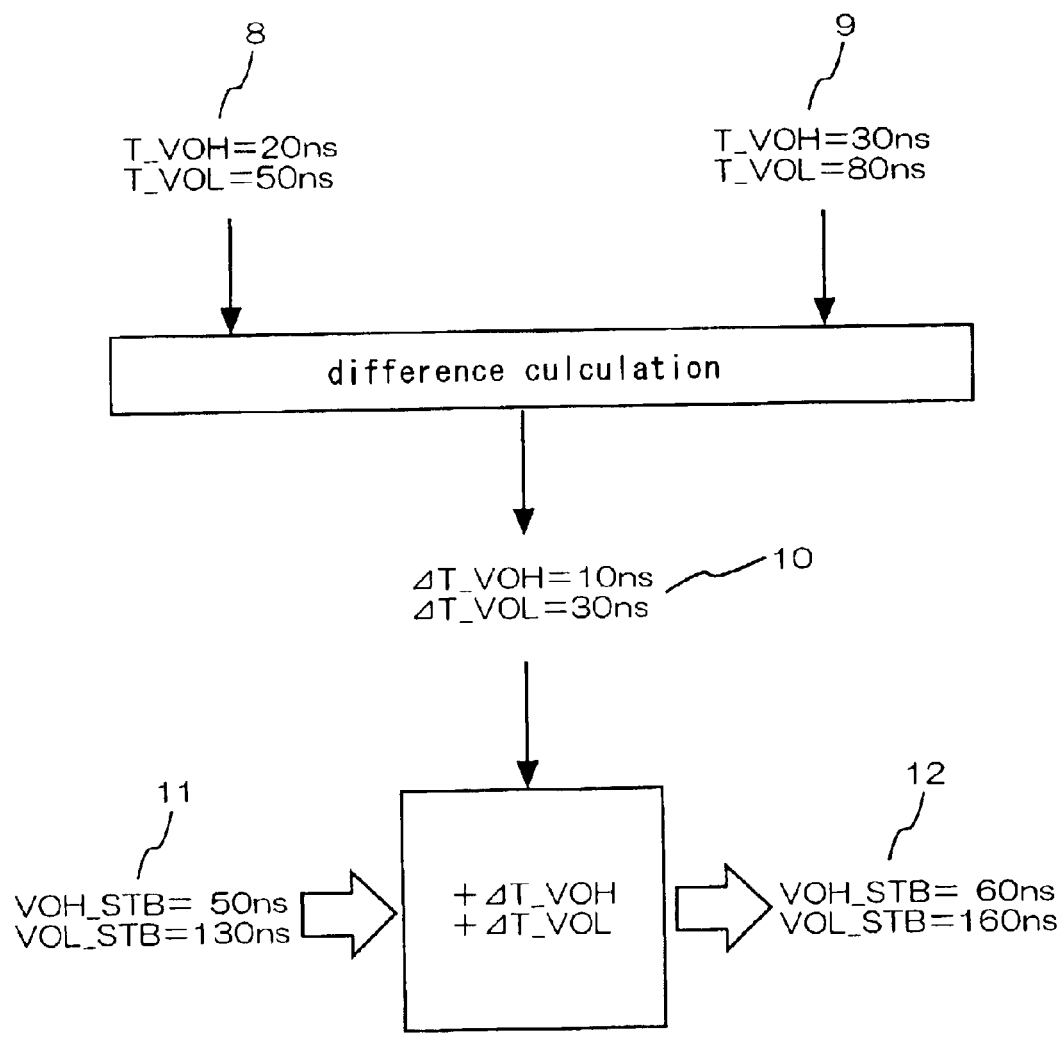
FIG. 3 outlines a program conversion method according to the invention.

The invention is intended to provide a method for always obtaining the same test results after replacement of a tester by absorbing deviations due to differences in transmission characteristics by a test program that is run on the tester. FIG. 3 outlines a method according to the invention. In the method according to the invention, first, a test environment of an LSI is modeled as shown in FIGS. 1A and 1B and a simulation is performed by a circuit simulator by using, as input values, various parameters such as inductance, resistance, and capacitance of each of the LSI, a test board, and a tester. For example, assume that results 8 shown in FIG. 3 are obtained as a result of a simulation on the test environment of FIG. 1A and results 9 shown in FIG. 3 are obtained as a result of a simulation on the test environment of FIG. 1B. In FIG. 3, symbol T_VOH denotes time when the signal reached the level VOH and symbol T_VOL denotes time when the signal reached the level VOL.

Then, as shown in FIG. 3, differences between two kinds of simulation results are calculated, whereby difference information 10 is obtained. In FIG. 3, symbol ΔT_VOH denotes a difference between the T_VOH values and symbol ΔT_VOL denotes a difference between the T_VOL values.

Then, a test specification of a test program that was generated for one tester is modified based on the obtained difference information 10, whereby a test program for the other tester is generated. Now assume that in a test program used in the test environment of FIG. 1A specifications 11 of waveform observation timing are defined as VOH_STB=50 ns and VOL_STB=130 ns as shown in FIG. 3. In this case, specifications 12 for a test program to be used in the test environment of FIG. 1B are obtained by adding the difference information 10 to the specifications 11. As seen from FIG. 3, as a result of the addition of the difference information 10 to the specifications 11, specifications 12 are obtained in such a manner that VOH_STB=50 ns+10 ns=60 ns and VOL_STB=130 ns+30 ns=160 ns.

As described above, according to the method of the invention, difference information is obtained by performing a simulation in advance and a test program is converted by using the difference information. Therefore, the problem that two kinds of test results obtained before and after replacement of a tester do not coincide with each other can be prevented with small labor. As a result, the period necessary for program conversion can be shortened and the test efficiency can be increased.

Figure 4:
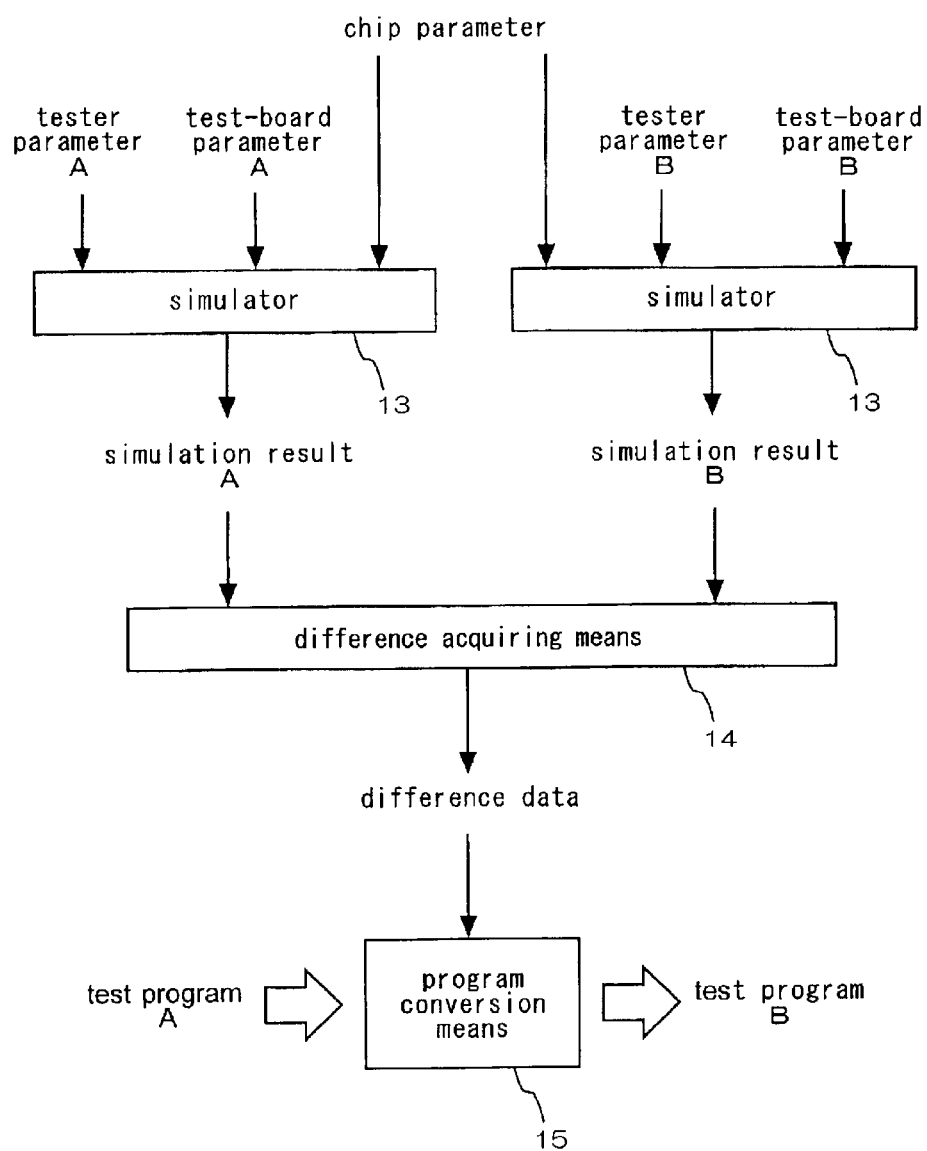
FIG. 4 shows the configuration and function of a program conversion system according to the invention.

An automatic conversion system will be described below in which a series of steps from the above-described simulation to the above-described program conversion is executed automatically. This automatic conversion system is provided with a program conversion program according to the invention for performing automatic conversion. FIG. 4 shows components of the automatic conversion system together with flows of data to be processed. In other words, FIG. 4 shows a process to be executed by the automatic conversion program that is provided in this system.

Figure 5:
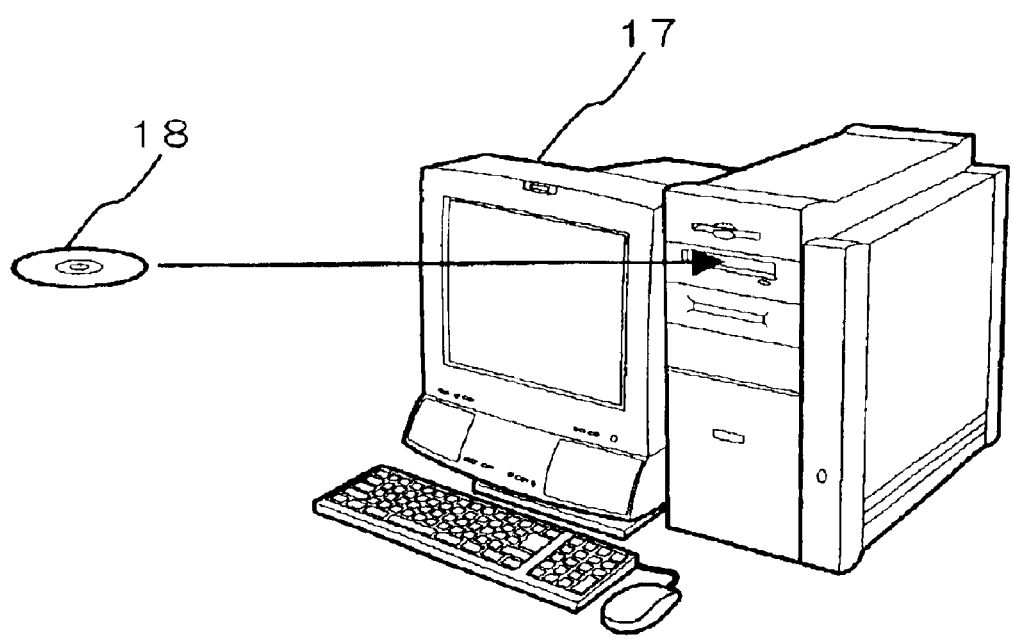
FIG. 5 shows an appearance of the program conversion system according to the invention.

The automatic conversion system is equipped with a simulator 13, a difference acquiring means 14, and a program converting means 15. Each of these components may be hardware. However, usually, they are implemented as programs that run on a personal computer 17 (or a workstation) as shown in FIG. 5. Those programs may be provided in such a manner as to be recorded in a recording medium 18 such as a CD-ROM and may be used after being installed in the personal computer 17.

The simulator 13 performs a circuit simulation using, as input values, parameters of a pin electronics unit of a tester, parameters of a test board used, and chip parameters. The simulation produces, as an output, a waveform that is obtained when the chip is tested by using the tester and the test board. The test result waveform is stored in a storage medium such as a hard disc drive or a memory in the form of data that characterize the waveform, such as time when the signal reaches the level VOH. The system may be equipped with either a single simulator 13 or a plurality of simulators 13. Where the system is equipped with a plurality of simulators 13, simulations can be performed parallel for two kinds of test environments and hence the operation speed of the system can be increased. Alternatively, simulations may be performed successively by using a single simulator 13.

The difference acquiring means 14 captures two kinds of simulation results A and B that were stored in the storage medium by the simulator 13, and stores differences (difference data) in the storage medium such as a hard disk drive or a memory.

The program conversing means 15 reads a test program A that was generated so as to conform to a first test environment and also reads the stored difference data from the storage medium. The program converting means 15 rewrites part of the specification of the test program A and outputs a test program B for a second test environment.

According to the automatic program conversion system according to this embodiment, a person in charge of tests can obtain a test program for a second test environment by merely inputting, to the system, various parameters and a test program that was generated for a first test environment. A test program that is assured in quality can be generated easily in a short time without being influenced by the skill of a person in charge. Therefore, a person in charge of tests is released from work of rewriting a program he is required to do conventionally.

The program conversion method and system according to embodiments of the invention have been described above. Next, a test board designing system according to the invention will be described. This system is to automatically determine, at the stage of designing a test board, test board parameters so as to dispense with program conversion, that is, so that the waveforms at points C1 and C2 in FIGS. 1A and 1B coincide with each other.

Figure 6:
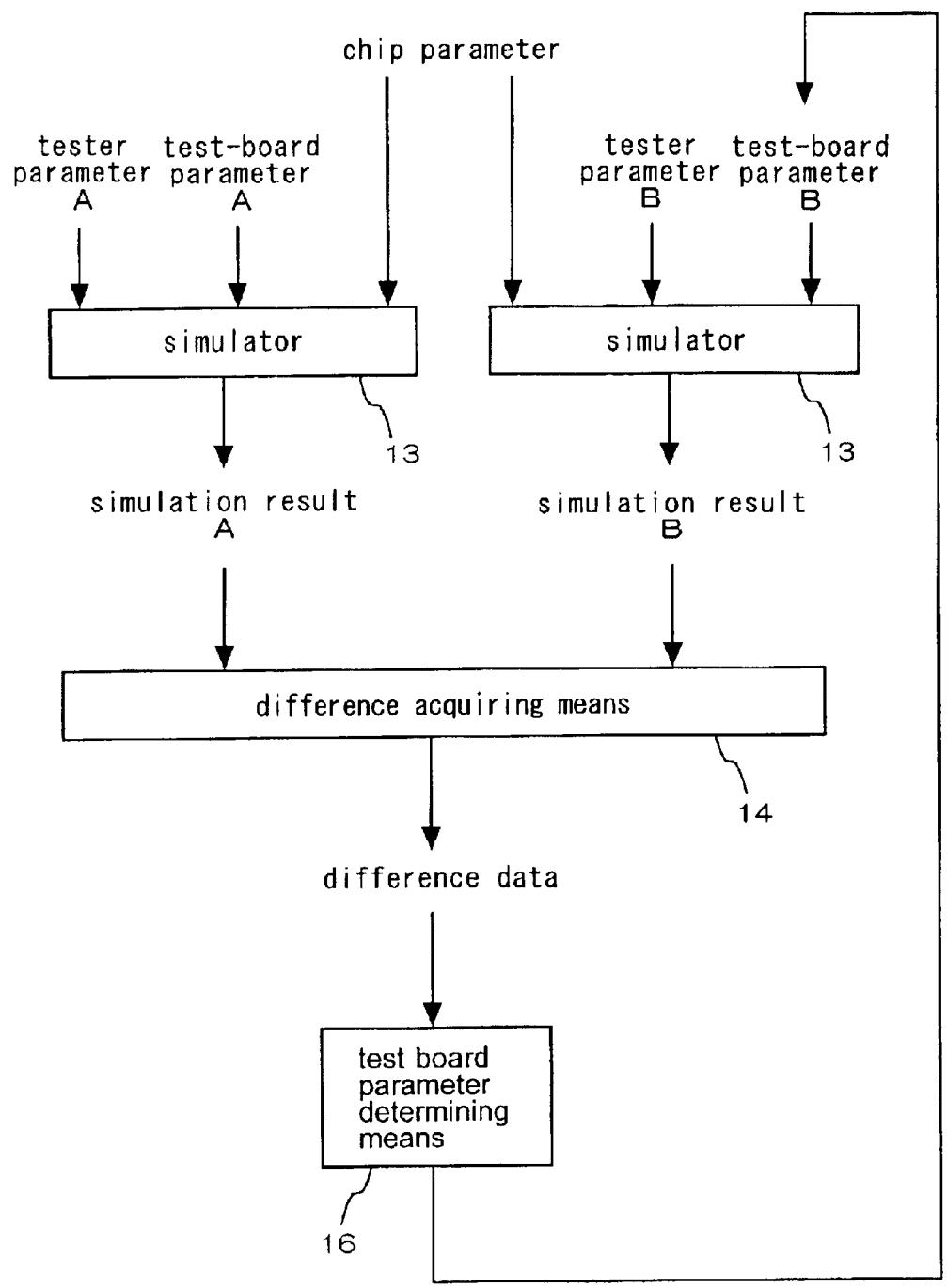
FIG. 6 shows the configuration and function of a test board designing system according to the invention.

FIG. 6 shows the configuration of the test board designing system. The functions of the simulator 13 and the difference acquiring means 14 are the same as in the above-described automatic program conversion system. The test board designing system is different from the above-described automatic program conversion system in that the former is equipped with a test board parameter values re-setting means 16 that judges whether the values of difference data acquired by the difference acquiring means 14 equal to zero and re-sets the values of the test board parameters B if the values of the difference data are not equal to zero. The test board designing system is also implemented as programs that run on a personal computer 17 (or a workstation) as shown in FIG. 5. Those programs may be provided in such a manner as to be recorded in a recording medium 18 such as a CD-ROM and may be used after being installed in the personal computer 17.

The re-setting of the values of the test board parameters B by the test board parameter values re-setting means 16 and the simulations by the simulator 13 are repeated until the values of the difference data finally become equal to zero. When the values of the difference data become equal to zero, the test board parameters B should have such values that the waveforms at points C1 and C2 in FIGS. 1A and 1B coincide with each other. Therefore, even if a tester is replaced by a new one, the same test results as before the replacement of the tester can be obtained by producing a test board having parameters determined by this system and using it for a test. Specifically, the kinds of wires used in a test board at the stage of designing a DUT board or a probe card and their lengths widths, and thicknesses, the thickness of an insulator, and other parameters are adjusted.

In this case, it is not necessary to modify a test program or adjust a test board on a trial-and-error basis. Further, even a person having no special knowledge can determine optimum test board parameters. That is, the load of test board designing can be reduced.

The above-described invention is summarized as follows.

The applicant proposes a program conversion method for converting a test program for a semiconductor integrated circuit, comprising the steps of simulating a transmission line characteristic from a semiconductor integrated circuit that is assumed to be mounted on a first test board to a first tester that is assumed to be connected to the first test board based on chip parameters indicating a circuit characteristic of the semiconductor integrated circuit, first test board parameters indicating a circuit characteristic of the first test board, and first tester parameters indicating a circuit characteristic of the first tester; simulating a transmission line characteristic from the semiconductor integrated circuit that is assumed to be mounted on a second test board to a second tester that is assumed to be connected to the second test board based on the chip parameters, second test board parameters indicating a circuit characteristic of the second test board, and second tester parameters indicating a circuit characteristic of the second tester; calculating a difference between the transmission characteristic from the semiconductor integrated circuit to the first tester and the transmission characteristic from the semiconductor integrated circuit to the second tester; and converting a first program that was generated so as to conform to the first test board and the first tester into a second test program for the second test board and the second tester based on the calculated difference.

The applicant further proposes a program conversion system for converting a test program for a semiconductor integrated circuit, comprising a simulator for simulating a transmission line characteristic from a semiconductor integrated circuit that is assumed to be mounted on a test board to a tester that is assumed to be connected to the test board based on chip parameters indicating a circuit characteristic of the semiconductor integrated circuit, test board parameters indicating a circuit characteristic of the test board, and tester parameters indicating a circuit characteristic of the tester; difference acquiring means for calculating a difference between a transmission characteristic from the semiconductor integrated circuit to a first tester that is assumed to be connected to a first test board and a transmission characteristic from the semiconductor integrated circuit to a second tester that is assumed to be connected to a second test board based on simulation results of the simulator; and program converting means for converting a first test program that was generated so as to conform to the first test board and the first tester into a second test program for the second test board and the second tester based on the calculated difference.

The applicant also proposes a program for realizing the above program conversion system, the program causing a computer to execute the steps of simulating a transmission line characteristic from a semiconductor integrated circuit that is assumed to be mounted on a first test board to a first tester that is assumed to be connected to the first test board based on chip parameters indicating a circuit characteristic of the semiconductor integrated circuit, first test board parameters indicating a circuit characteristic of the first test board, and first tester parameters indicating a circuit characteristic of the first tester; simulating a transmission line characteristic from the semiconductor integrated circuit that is assumed to be mounted on a second test board to a second tester that is assumed to be connected to the second test board based on the chip parameters, second test board parameters indicating a circuit characteristic of the second test board, and second tester parameters indicating a circuit characteristic of the second tester; calculating a difference between the transmission characteristic from the semiconductor integrated circuit to the first tester and the transmission characteristic from the semiconductor integrated circuit to the second tester; and converting a first program that was generated so as to conform to the first test board and the first tester into a second test program for the second test board and the second tester based on the calculated difference.

This program can be distributed in such a manner as to be recorded on recording media such as CD-ROMs, DVDs, or the like.

According to the above program conversion method and system and the program, a test program for a new tester is generated automatically in replacing a tester. Therefore, the load of tester replacement work can be reduced and test programs that are uniform in quality can always be obtained.

Still further, the applicant proposes a test board designing system for designing a test board to be used for a test of a semiconductor integrated circuit, comprising a simulator for simulating a transmission line characteristic from a semiconductor integrated circuit that is assumed to be mounted on a test board to a tester that is assumed to be connected to the test board based on chip parameters indicating a circuit characteristic of the semiconductor integrated circuit, test board parameters indicating a circuit characteristic of the test board, and tester parameters indicating a circuit characteristic of the tester; difference acquiring means for calculating a difference between a transmission characteristic from the semiconductor integrated circuit to a first tester that is assumed to be connected to a first test board and a transmission characteristic from the semiconductor integrated circuit to a second tester that is assumed to be connected to a second test board based on simulation results of the simulator; and test board parameters determining means for determining test board parameters indicating a new circuit characteristic of the second test board so that the calculated difference becomes equal to zero.

The applicant also proposes a test board designing program for realizing the above test board designing system, the test board designing program causing a computer to execute the steps of simulating a transmission line characteristic from a semiconductor integrated circuit that is assumed to be mounted on a first test board to a first tester that is assumed to be connected to the first test board based on chip parameters indicating a circuit characteristic of the semiconductor integrated circuit, first test board parameters indicating a circuit characteristic of the first test board, and first tester parameters indicating a circuit characteristic of the first tester; simulating a transmission line characteristic from the semiconductor integrated circuit that is assumed to be mounted on a second test board to a second tester that is assumed to be connected to the second test board based on the chip parameters, second test board parameters indicating a circuit characteristic of the second test board, and second tester parameters indicating a circuit characteristic of the second tester; calculating a difference between the transmission characteristic from the semiconductor integrated circuit to the first tester and the transmission characteristic from the semiconductor integrated circuit to the second tester; and determining test board parameters indicating a new circuit characteristic of the second test board so that the calculated difference becomes equal to zero. This test board designing program may also be distributed in such a manner as to be recorded on recording media.

The above test board designing system and program automatically determine test board parameters suitable for a replacement tester and thereby reduce the load of designing a test board. This makes program conversion unnecessary and hence makes it unnecessary to manage a large number of programs for respective testers, which means reduction of the load of such management.

It is further understood that the foregoing description is a preferred embodiment of the disclosed apparatus and that various changes and modifications may be made in the invention without departing from the spirit and scope thereof.

The entire disclosure of a Japanese Patent Application No. 2002-039138, filed on Feb. 15, 2002 including specification, claims drawings and summary, on which the Convention priority of the present application is based, are incorporated herein by reference in its entirety.

What is claimed is:

1. A program conversion system for converting a test program for a semiconductor integrated circuit, comprising:

a simulator for simulating a transmission line characteristic from a semiconductor integrated circuit that is assumed to be mounted on a test board to a tester that is assumed to be connected to the test board based on chip parameters indicating a circuit characteristic of the semiconductor integrated circuit, test board parameters indicating a circuit characteristic of the test board, and tester parameters indicating a circuit characteristic of the tester;

difference acquiring means for calculating a difference between a transmission characteristic from the semiconductor integrated circuit to a first tester that is assumed to be connected to a first test board and a transmission characteristic from the semiconductor integrated circuit to a second tester that is assumed to be connected to a second test board based on simulation results of the simulator; and program converting means for converting a first test program that was generated so as to conform to the first test board and the first tester into a second test program for the second test board and the second tester based on the calculated difference.

2. A test board designing system for designing a test board to be used for a test of a semiconductor integrated circuit, comprising:

a simulator for simulating a transmission line characteristic from a semiconductor integrated circuit that is assumed to be mounted on a test board to a tester that is assumed to be connected to the test board based on chip parameters indicating a circuit characteristic of the semiconductor integrated circuit, test board parameters indicating a circuit characteristic of the test board, and tester parameters indicating a circuit characteristic of the tester;

difference acquiring means for calculating a difference between a transmission characteristic from the semiconductor integrated circuit to a first tester that is assumed to be connected to a first test board and a transmission characteristic from the semiconductor integrated circuit to a second tester that is assumed to be connected to a second test board based on simulation results of the simulator; and test board parameters determining means for determining test board parameters indicating a new circuit characteristic of the second test board so that the calculated difference becomes equal to zero.

* * * * *